(12) United States Patent  
Gurumurthy

(10) Patent No.: US 9,366,727 B2  
(45) Date of Patent: Jun. 14, 2016

(54) HIGH DENSITY LOW POWER SCAN FLIP-FLOP

(71) Applicant: Texas Instruments Incorporated, Dallas, TX (US)

(72) Inventor: Girishankar Gurumurthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 174 days.

(21) Appl. No.: 14/107,932

(22) Filed: Dec. 16, 2013

(65) Prior Publication Data

US 2014/0189453 A1  Jul. 3, 2014

Related U.S. Application Data

(60) Provisional application No. 61/746,780, filed on Dec. 28, 2012.

(51) Int. Cl.  
*G01R 31/28* (2006.01)  
*G01R 31/3185* (2006.01)

(52) U.S. Cl.  
CPC *G01R 31/318541* (2013.01); *G01R 31/318575* (2013.01)

(58) Field of Classification Search  
None  
See application file for complete search history.

(56) References Cited

U.S. PATENT DOCUMENTS

| | | | |
|---|---|---|---|
| 6,412,098 B1* | 6/2002 | Jin | G01R 31/31725 716/106 |
| 2006/0085708 A1* | 4/2006 | Howard | G01R 31/318544 714/726 |
| 2014/0040688 A1* | 2/2014 | Zhang et al. | 714/727 |

* cited by examiner

*Primary Examiner* — Sam Rizk  
(74) *Attorney, Agent, or Firm* — John R. Pessetto; Frank D. Cimino

(57) ABSTRACT

A scan flip flop includes a partial multiplexer coupled to a master latch. The partial multiplexer is configured to receive a scan enable (SCAN) where the partial multiplexer includes an OR gate coupled to a tri-stated AND gate. A tri-state inverter is coupled to an output of the master latch and a slave latch is configured to receive an output of the tri-state inverter. A delay element is coupled to the slave latch, where the delay element is configured to delay a first output of the slave latch in response to the scan enable to generate a dedicated scan output.

20 Claims, 4 Drawing Sheets

HIGH DENSITY LOW POWER SCAN FLIP-FLOP

This application claims the benefit of Provisional Application No. 61/746,780, filed December 28, 2012.

TECHNICAL FIELD

Embodiments of the disclosure relate to a high density scan flip flop in an integrated circuit (IC).

BACKGROUND

Flip-flops in ICs function when an input signal is maintained constant for a hold time, which is a predefined time interval after a clock input edge. If a series of flip-flops are used, a signal from one flip-flop should reach the succeeding flip-flop after the completion of the hold time of the succeeding flip-flop. Typically, in a high density flip-flop, only one port is used as either a data output or a scan output. The scan output is obtained at the data output when a scan enable SCAN is selected. A dedicated scan output is not generated on a separate port as it results in increase in the area of the flip flop.

In newer technology nodes, to meet performance goals a fast data path is required. A scan test in a scan flip-flop involves scan shift-in, capture and shift-out operation. The path on which the scan shift-in, capture and shift-out operation is implemented is called the scan-shift path. By using the same port for both the data output and the scan output, an input signal speeds up on the scan-shift path resulting in hold time violations (where the scan-shift path cannot be maintained). Hold time violations are therefore a result of the fast data paths between successive flip-flops, hence hold timing closure is a major concern for any flip-flop design.

One way to maintain the hold timing for scan shift operation is to use a delayed clock. However, it is challenging to meet performance goals on the data path as the data path requires a relatively fast clock. Buffers are used to prevent hold-time violations, but conventional methods of introducing delay using buffers are inefficient with respect to power consumption and size. Hence, there exists a need for a high-density flip-flop that can address back to back scan-shift hold issues.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides a scan flip-flop. The scan flip-flop includes a partial multiplexer coupled to a master latch. The partial multiplexer is configured to receive a scan enable 'SCAN' where the partial multiplexer includes an OR gate coupled to a tri-stated AND gate. A tri-state inverter is coupled to an output of the master latch and a slave latch is configured to receive an output of the tri-state inverter. A delay element is coupled to the slave latch, where the delay element is configured to delay a first output of the slave latch in response to the scan enable SCAN to generate a dedicated scan output.

Another example embodiment provides an apparatus. The apparatus includes a scan chain element configured to generate a dedicated scan chain output. The scan chain element includes a plurality of scan flip-flops that are connected serially. A first scan flip-flop of the plurality of scan flip-flops is placed at a beginning of the scan chain element. A scan data input which is received at each of the plurality of scan flip-flops is a dedicated scan output of a previous scan flip-flop, except for the first scan flip-flop. Each of the plurality of scan flip-flops includes a partial multiplexer coupled to a master latch. The partial multiplexer is configured to receive a scan enable SCAN where the partial multiplexer includes an OR gate coupled to a tri-stated AND gate. A tri-state inverter is coupled to an output of the master latch and a slave latch is configured to receive an output of the tri-state inverter. A delay element is coupled to the slave latch. The delay element is configured to delay a first output of the slave latch in response to the scan enable SCAN to generate a dedicated scan output.

An example embodiment provides a method of generating a dedicated scan output at an output of a scan flip-flop includes selecting one of a data input and a scan data input using a partial multiplexer coupled to a master latch, in response to a scan enable. The partial multiplexer includes an OR gate and a tri-stated AND gate. In the method, an output of the master latch is inverted using a tri-state inverter to generate an input to a slave latch. Then, a first output of the slave latch is delayed in response to the scan enable. Further, the dedicated scan output is generated at the first output of the slave latch using a delay element.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
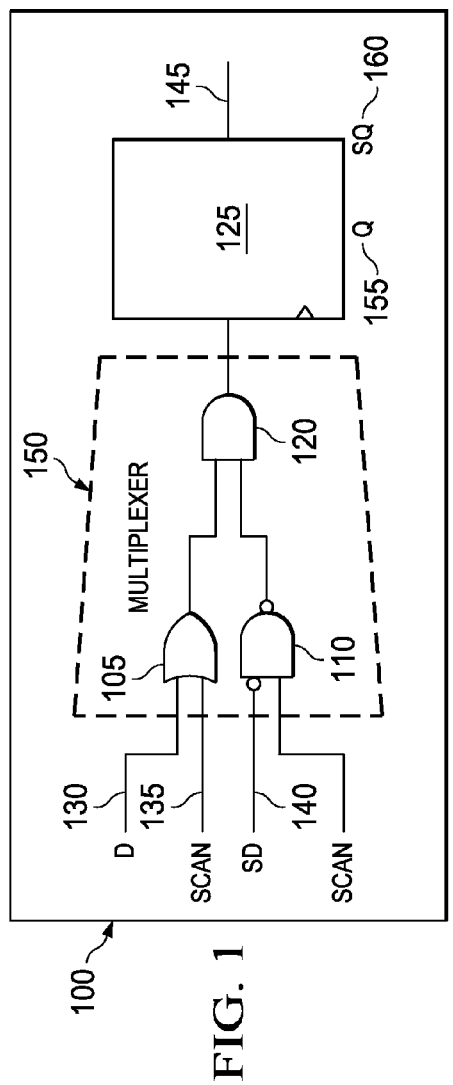
FIG. 1 illustrates a schematic of a scan flip-flop.

FIG. 1 illustrates a schematic of a scan flip-flop (100). The scan flip flop (100) includes a multiplexer (150) which is implemented using an OR gate (105), a single-input bubbled NAND gate (110) and an AND gate (120). The OR gate (105) receives a data input D (130) and a scan enable SCAN (135). The scan enable SCAN (135) is also given as input to the single-input bubbled NAND gate (110) in addition to a scan data input SD (140) given at the bubbled end. The AND gate (120) receives the outputs of the OR gate (105) and the single-input bubbled NAND gate (110), and is coupled to the flip-flop (125). The output of the flip-flop (125) is seen on the output port (145), which is used for both a data output Q (155) and a scan output SQ (160).

The operation of the scan flip-flop illustrated in FIG. 1 is explained now. The multiplexer (150) selects either the data input D (130) or the scan data input SD (140) in response to the scan enable SCAN (135). Considering an example when the scan enable SCAN (135) is enabled, the multiplexer (150) selects the scan data input SD (140). The flip-flop (125) stores the scan data input SD (140) and generates the scan output SQ (160) at the output port (145). Considering an example when the scan enable SCAN (135) is disabled, the selects the data input D (130). The flip-flop (125) stores the data input D (130) and generates the data output Q (155) at the output port (145). It is thus seen that the scan output SQ (160) is obtained at the same output port (145) as the data output Q (155), when the scan enable SCAN (135) is selected. A dedicated scan output is not generated on a separate port as it results in increase in the area of the flip flop. By using the same output port (145) for both the data output Q (155) and the scan output SQ (160), the input signal i.e., scan data input SD (140) speeds up on the scan-shift path and thus the hold timing in the scan-shift path cannot be maintained. Hold time violations are therefore the result of the fast data paths between successive flip-flops and hence hold timing closure is a major concern for the flip-flop (100) design.

Figure 2:
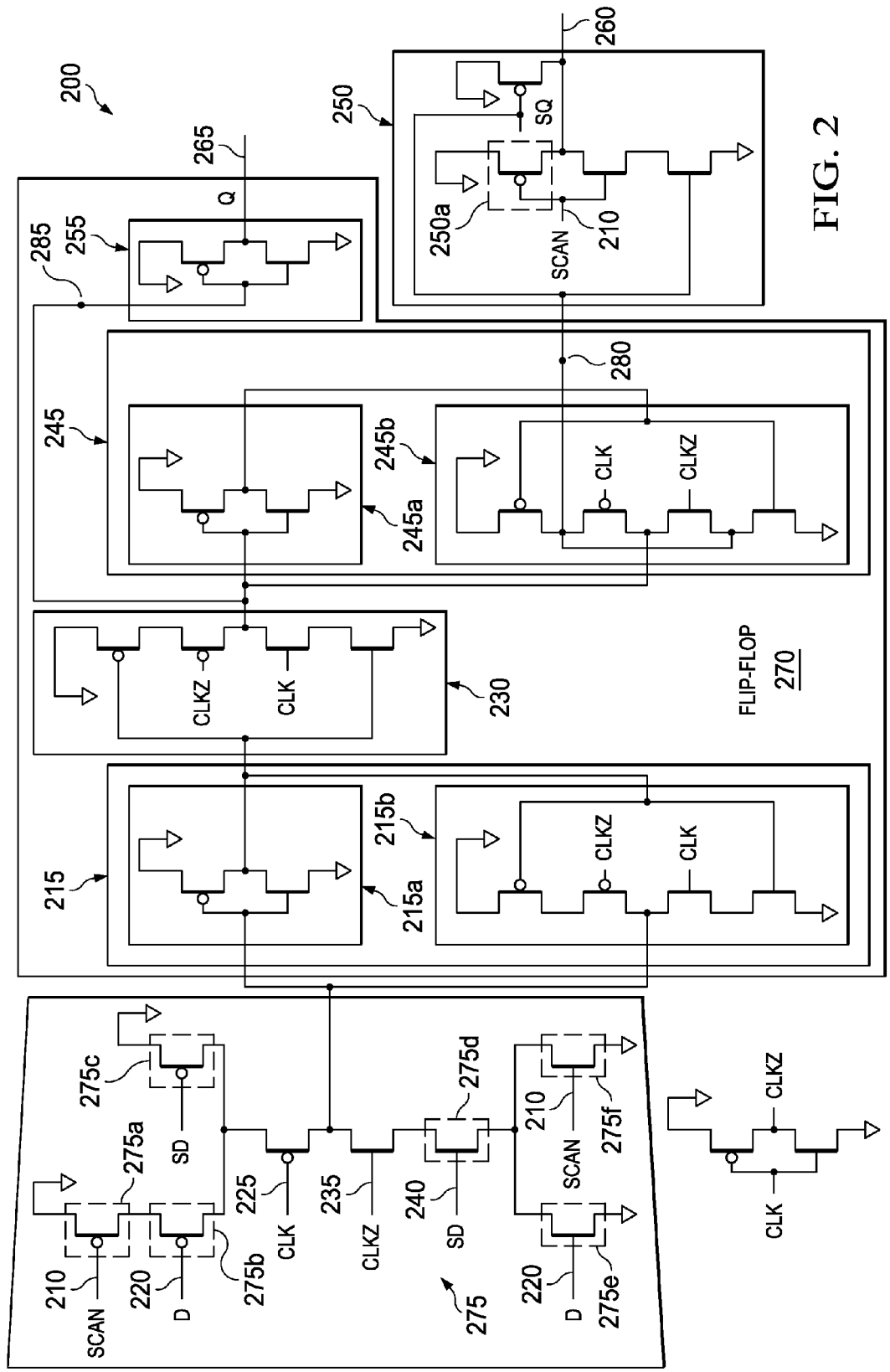
FIG. 2 illustrates a schematic of a transistor level implementation of a scan flip-flop according to an embodiment.

FIG. 2 illustrates a schematic of a transistor level implementation of a scan flip-flop (200) according to an embodiment. The scan flip flop (200) includes a partial multiplexer (275) coupled to a master latch (215). The partial multiplexer (275) includes an OR gate coupled to a tri-stated AND gate, and is configured to receive a scan enable SCAN (210). The OR gate and the tri-stated AND gate are implemented using the transistors 275 (a), (b), (c), (d), (e) and (f). An output of the master latch (215) is coupled to a tri-state inverter (230) and a slave latch (245) is configured to receive an output of the tri-state inverter (230). A delay element (250) is coupled to the slave latch (245), where the delay element (250) is configured to delay a first output (280) of the slave latch (245) in response to the scan enable SCAN (210) to generate a dedicated scan output (260). A second output of the slave latch is a data output (265). The scan flip-flop (200) is implemented using PMOS and NMOS transistors.

The partial multiplexer (275) receives a data input D (220), a scan data input SD (240), a clock input (225), an inverted clock input (235) and selects one of the data input D (220) and the scan data input SD (240) in response to the scan enable SCAN (210). The partial multiplexer (275) is coupled to the master latch (215) which includes a first plurality of back-to-back connected inverters. Each of the first plurality of back-to-back connected inverters includes an inverter 215(a) coupled to a tri-state inverter 215(b). The master latch (215) is coupled to the tri-state inverter (230) which is further coupled to the slave latch (245). The slave latch (245) includes a second plurality of back-to-back connected inverters. Each of the second plurality of back-to-back connected inverters includes an inverter 245(a) coupled to a tri-state inverter 245(b). The slave latch generates two outputs, a first output (280) and a second output (285). An output of the tri-state inverter 245(b) of the slave latch (245) is the first output (280) and it is coupled to the single-input bubbled NAND gate (250). The single-input bubbled NAND gate (250) is configured to generate the dedicated scan output (260) in response to the scan enable SCAN (210). The dedicated scan output (260) is generated without inverting the scan enable SCAN (210). In a data state the dedicated scan output (260) is configured such that it does not toggle as it is tied to a logic 'high' state. The second output (285) of the slave latch (245) is coupled to a first inverter (255). The first inverter (255) is configured to generate the data output (265). The terms single-input bubbled NAND gate and delay element are used interchangeably for the purposes of FIG. 2.

In operation, the partial multiplexer (275) selects either data input D (220) or scan data input SD (240) according to the scan enable SCAN (210) when the clock input (225) is triggered. Considering an example when the scan enable SCAN (210) is enabled, the partial multiplexer (275) selects the scan data input SD (240). The scan data input SD (240) is passed to the master latch (215). The master latch (215) stores the scan data input SD (240) using back-to-back connected inverters 215(a) and 215(b). The output of the master latch (215) is inverted using the tri-state inverter (230) and is applied to the slave latch (245). The slave latch (245) stores the output of the master latch (215) using back-to-back connected inverters 245(a) and 245(b). The slave latch (245) generates the first output (280) and the second output (285). The first output (280) is NANDed with the scan enable SCAN (210) using the single-input bubbled NAND gate (250) to generate the dedicated scan output (260). Considering an example when the scan enable SCAN (210) is disabled; the partial multiplexer (275) selects the data input D (220). The data input D (220) is passed to the master latch (215). The master latch (215) stores the data input D (220) using back-to-back connected inverters 215(a) and 215(b). The output of the master latch (215) is inverted using the tri-state inverter (230) and is applied to the slave latch (245). The slave latch (245) stores the inverted output of the master latch (215) using back-to-back connected inverters 245(a) and 245(b). The slave latch (245) generates the first output (280) and the second output (285). The first output (280) is NANDed with the scan enable SCAN (210) using the single-input bubbled NAND gate (250). Since the scan enable SCAN (210) is disabled, the PMOS transistor 250(a) is turned on, therefore passing logic 'high' to the dedicated scan output (260). Hence in the data state, i.e. when the scan enable SCAN (210) is disabled the dedicated scan output (260) is tied to logic 'high' state such that the dedicated scan output (260) does not toggle, thereby reducing the associated power consumption. The dedicated scan output (260) is generated without inverting the scan enable SCAN (210). Thus the scan flip-flop 200 generates dedicated scan output (260), with a reduction in the amount of hold time violations in the scan-shift path and without increasing the number of transistors compared to the scan flip-flop in FIG. 1.

Figure 3:
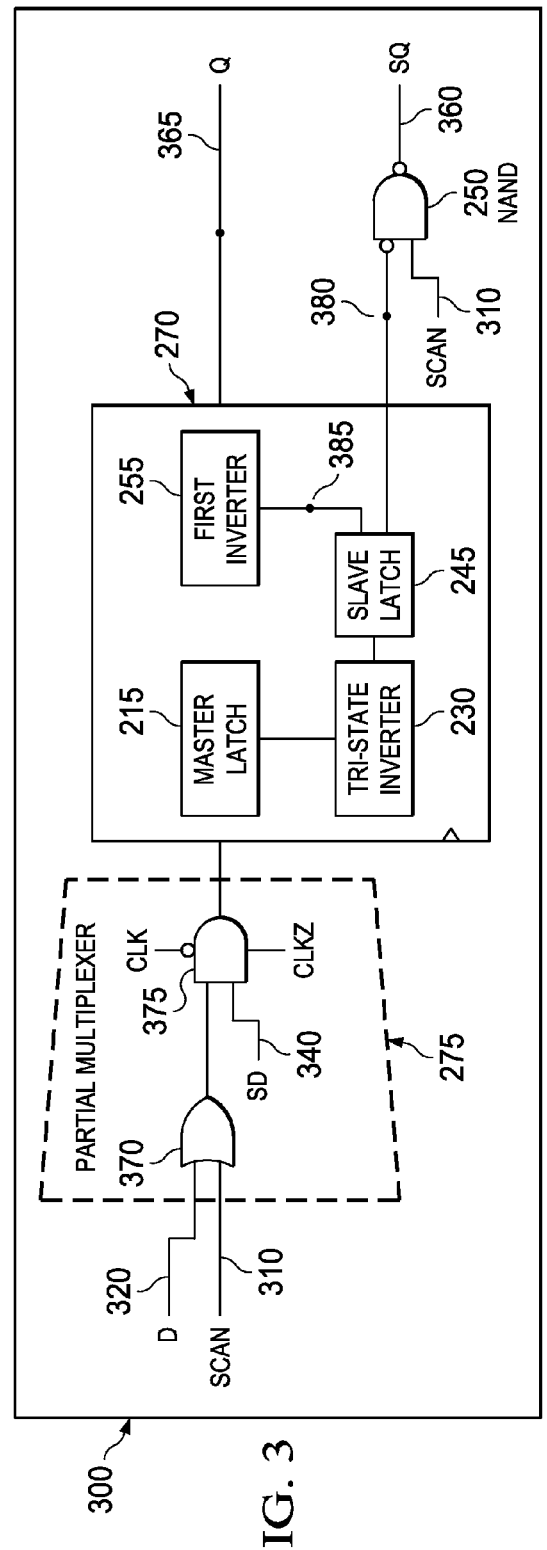
FIG. 3 illustrates a block diagram of the scan flip-flop illustrated in FIG. 2.

FIG. 3 illustrates a block diagram of the scan flip-flop according to an embodiment. The scan flip-flop (300) includes a partial multiplexer (275) which includes an OR gate (370) coupled to a tri-stated AND gate (375). The OR gate (370) receives a data input D (320) and a scan enable SCAN (310). The tri-stated AND gate (375) receives a scan data input SD (340) in addition to an output of the OR gate (370). An output of the tri-stated AND gate (375) of the partial multiplexer (275) is applied to a flip-flop (270). The flip-flop (270) includes a master latch (215) coupled to a tri-state inverter (230) and a slave latch (245) coupled to the tri-state inverter (230). The flip-flop (270) also includes a first inverter (255) coupled to a second output (385) of the slave latch (245). The first inverter (255) inverts the second output (385) to generate a data output (365). A first output (380) of the slave latch (245) is coupled to a single-input bubbled NAND gate (250). The single-input bubbled NAND gate (250) receives the scan enable SCAN (310) in addition to the first output (380) of the slave latch (245) to generate a dedicated scan output (360).

The scan flip-flop (300) is analogous to the scan flip-flop described in FIG. 2 both in connections and operation. The scan flip-flop (300) generates the dedicated scan output (360) without inverting the scan enable SCAN (310) and hence saving on the power dissipation due to inverter short circuit power. In the data state, i.e. when the scan enable SCAN (310) is disabled, the dedicated scan output (360) is tied to logic 'high' state such that the dedicated scan output (360) does not toggle, thereby reducing the associated power consumption.

Therefore, the scan flip-flop (300) generates the dedicated scan output (360), with a reduction in the amount of hold time violations in the scan-shift path and without increasing the number of transistors compared to the scan flip-flop in FIG. 1.

Figure 4:
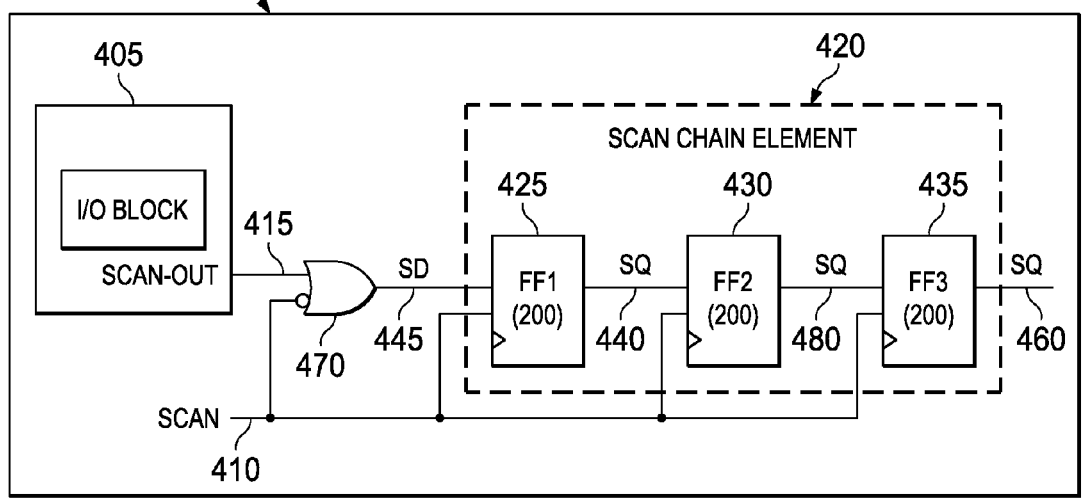
FIG. 4 illustrates a schematic of an apparatus using scan flip-flops according to an embodiment.

FIG. 4 illustrates a schematic of an apparatus (400) using scan flip-flops (200) according to an embodiment. The apparatus (400) includes a scan chain element (420) configured to generate a dedicated scan chain output (460). The scan chain element (420) includes a plurality of scan flip-flops (425, 430, and 435) that are connected serially. A first scan flip-flop (425) of the plurality of scan flip-flops (425, 430, and 435) is at the beginning of the scan chain element (420). A first scan data input SD (445) is generated at an input of the first scan flip-flop (425) using an OR gate (470). The OR gate (470) receives a scan enable SCAN (410) which is inverted, and a scan output (415) of an input/output block (405); such that the first scan data input SD (445) is configured to logic 'high' in the data state. A scan data input to each of the plurality of scan flip-flops (430 and 435) is a dedicated scan output of a previous scan flip-flop, except for the first scan flip-flop (425). For example, the dedicated scan output (440) of flip-flop FF1 (425) is the scan data input to flip-flop FF2 (430). Each of the plurality of scan flip-flops (425, 430, and 435) is analogous to the scan flip-flop 200, described in FIG. 2, in connections and operation and is not repeated for the sake of simplicity. Each of the plurality of scan flip-flops (425, 430, and 435) is implemented using PMOS and NMOS transistors and each of them include a partial multiplexer (275) coupled to a master latch (215).

Figure 5:
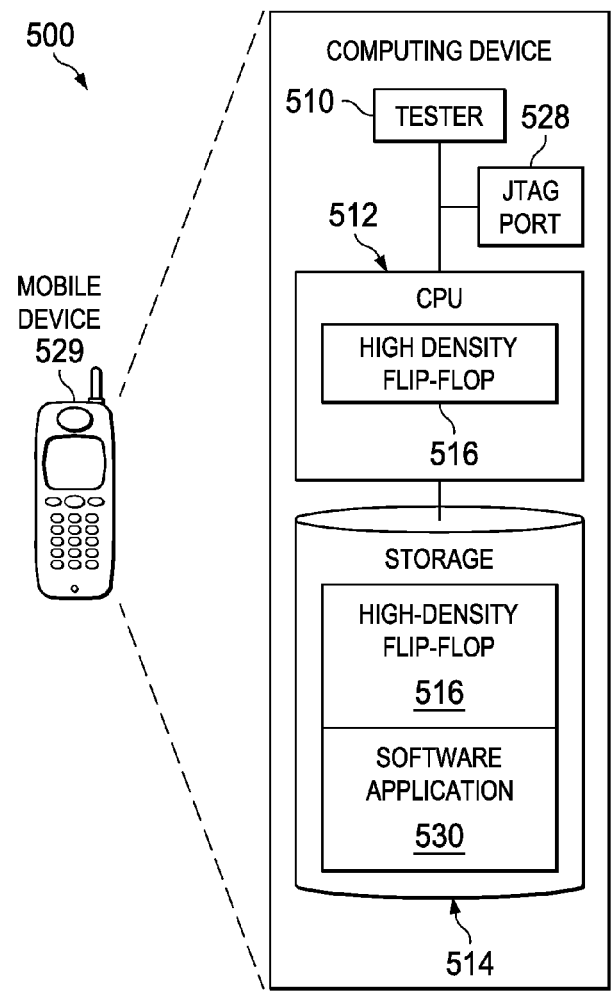
FIG. 5 illustrates a schematic of a computing device using the scan flip-flops of FIG. 2.

FIG. 5 illustrates a schematic of a computing device (500) using the scan flip-flops (200) according to an embodiment. The computing device (500) is, or is incorporated into, a mobile communication device (529), such as a mobile phone, a personal digital assistant, a personal computer, or any other type of electronic system.

In some embodiments, the computing device (500) includes a megacell or a system-on-chip (SoC) which includes control logic such as a CPU (512) (Central Processing Unit), a storage (514) (e.g., random access memory (RAM)) and tester (510). The CPU (512) can be, for example, a CISC-type (Complex Instruction Set Computer) CPU, RISC-type CPU (Reduced Instruction Set Computer), or a digital signal processor (DSP). The storage (514) (which can be memory such as RAM, flash memory, or disk storage) stores one or more software applications (530) (e.g., embedded applications) that, when executed by the CPU (512), perform any suitable function associated with the computing device (500). The tester (510) includes logic that supports testing and debugging of the computing device (500) executing the software application (530). For example, the tester (510) can be used to emulate a defective or unavailable component(s) of the computing device (500) to allow verification of how the component(s), if actually present on the computing device (500), would perform in various situations (e.g., how the component(s) would interact with the software application 530). In this way, the software application (530) can be debugged in an environment which resembles post-production operation.

The CPU (512) typically includes memory and logic which store information frequently accessed from the storage (514). Various subsystems (such as the CPU 512 and the storage 514) of the computing device (500) include scan flip-flops (200) (in the high density flip-flop 516), which are used during the execution the software application (530). Because of the relatively large size and the large numbers of instantiated scan flip-flops (200), using the same port for a data output and a scan output can lead to severe hold time violations. Disclosed above are techniques for arranging scan flip-flops (200) (which are normally implemented as master/slave latches) having a dedicated scan output and reduced power usage during a data state. Each of the scan flip-flops is analogous to the scan flip-flop (200), described in FIG. 2, in connections and operation and is not repeated for the sake of simplicity. Each of the scan flip-flops (200) is implemented using PMOS and NMOS transistors and each of them include a partial multiplexer (275) coupled to a master latch (215).

The scan flip-flop (200) generates the dedicated scan output (260), with a reduction in the amount of hold time violations in the scan-shift path and without increasing the number of transistors compared to the scan flip-flop in FIG. 1. The power consumption in the computing device (500) is significantly reduced by using the scan flip-flop (200) as in the data state, i.e. when the scan enable SCAN (210) is disabled the dedicated scan output (260) is tied to logic 'high' state such that the dedicated scan output (260) does not toggle, thereby reducing the associated power consumption. Also the scan testing operation in the computing device (500) does not lead to hold time violations in the scan-shift path as the dedicated scan output (260) is generated.

Figure 6:
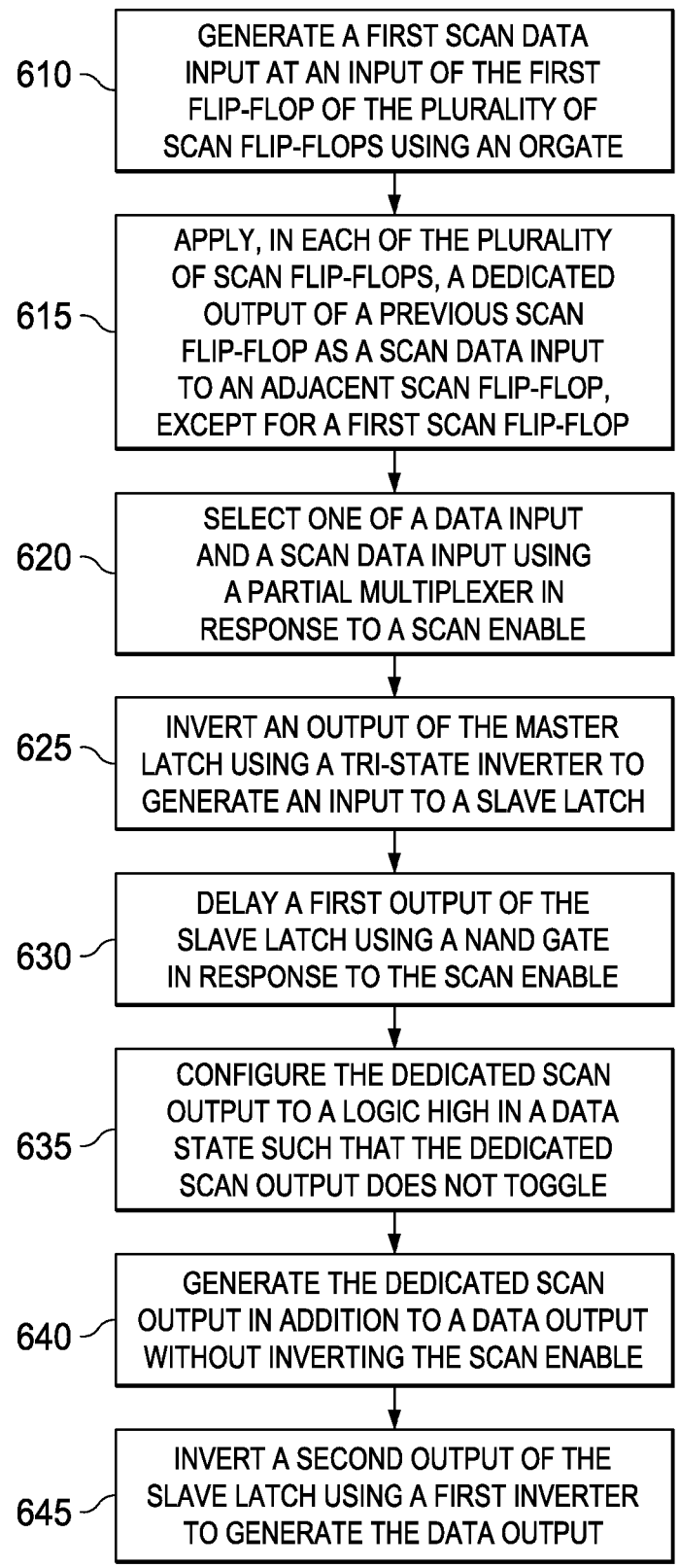
FIG. 6 is a flowchart of a method of generating a dedicated scan chain output at an output of an apparatus, according to an embodiment.

FIG. 6 is a flowchart 600 illustrating a method of generating a dedicated scan chain output (460) at an output of an apparatus (400), according to an embodiment. The apparatus (400) includes a scan chain element (420) configured to generate a dedicated scan chain output (460). The scan chain element (420) includes a plurality of scan flip-flops (425, 430, and 435) that are connected serially. A first scan flip-flop (425) of the plurality of scan flip-flops (425, 430, and 435) is at the beginning of the scan chain element (420). At step 610, a first scan data input SD (445) is generated at an input of the first flip-flop (425) using an OR gate (470). The OR gate (470) also receives the scan enable SCAN (410), such that the first scan data input SD (445) is configured to logic 'high' in the data state. Then at step 615, a dedicated output of a previous scan flip-flop is applied as a scan data input to an adjacent scan flip-flop in each of the plurality of scan flip-flops (430 and 435), except for the first scan flip-flop (425). An example of step 615 can be illustrated using FIG. 4. In the scan flip-flop 400, the dedicated scan output (440) of flip-flop FF1 (425) is the scan data input to flip-flop FF2 (430). Each of the plurality of scan flip-flops (425, 430, and 435) is analogous to the scan flip-flop (200), described in FIG. 2, in working and operation. Therefore, in the following steps a method to generate a dedicated scan output (260) at each of the scan flip-flops (425, 430, and 435) is described. At step 620, a partial multiplexer (275) selects one of a data input D (220) and a scan data input SD (240), in response to a scan enable SCAN (210). The partial multiplexer (275) is coupled to a master latch (215); the master latch (215) stores either scan data input SD (240) or data input D (220) using back-to-back connected inverters 215(a) and 215(b). Then at step 625, an output of the master latch (215) is inverted using a tri-state inverter (230) to generate an input to a slave latch (245). The slave latch (245) stores the inverted the output of the master latch (215) using back-to-back connected inverters 245(a) and 245(b). The slave latch (245) generates a first output (280) and second output (285). At step 630, the first output (280) of the slave latch (245) is delayed using a single-input bubbled NAND gate (250) in response to the scan enable SCAN (210), to generate the dedicated scan output (260). Further at step 635, the dedicated scan output (260) is configured to logic 'high' in a data state such that the dedicated scan output (260) does not toggle. At step 640, the dedicated scan output (260) is generated in addition to a data output (265) without inverting the scan enable SCAN (210). The data output is generated at step 645 by inverting a second output (285) of the slave latch using a first inverter (255).

The afore-mentioned method discloses a process of generating the dedicated scan output (260) in the scan flip-flop (200) hence reducing the number of hold time violations compared to the scan flip-flop (100) in FIG. 1. On implementing the described method in the flowchart (600), the dedicated scan output (260) can be generated without inverting the scan enable SCAN (210) and thereby there is no inverter short-circuit power loss. Further, in the data state, i.e. when the scan enable SCAN (210) is disabled the dedicated scan output (260) is tied to logic 'high' state such that the dedicated scan output (260) does not toggle, thereby reducing the associated power consumption.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A scan flip-flop comprising:
   a partial multiplexer coupled to a master latch, the partial multiplexer configured to receive a scan enable, wherein the partial multiplexer comprises an OR gate coupled to a tri-stated AND gate;
   a tri-state inverter coupled to an output of the master latch;
   a slave latch configured to receive an output of the tri-state inverter; and
   a delay element that is coupled to a first output of the slave latch; the delay element receives the scan enable and configured to generate a dedicated scan output, the delay element delays the first output of the slave latch in response to the scan enable.

2. The scan flip-flop of claim 1, wherein the partial multiplexer receives a data input, a scan data input, a clock input, an inverted clock input and selects one of the data input and the scan data input in response to the scan enable.

3. The scan flip-flop of claim 1, wherein the dedicated scan output is generated without inverting the scan enable.

4. The scan flip-flop of claim 1, wherein the delay element comprises a single-input bubbled NAND gate configured to delay the first output of the slave latch in response to the scan enable to generate the dedicated scan output; wherein in a data state the dedicated scan output is configured to a logic high state such that the dedicated scan output does not toggle.

5. The scan flip-flop of claim 1, further comprising:
   an inverter coupled to a second output of the slave latch, the inverter being configured to generate a data output.

6. The scan flip-flop of claim 1, wherein the master latch comprises a first plurality of back-to-back connected inverters and wherein, each of the first plurality of back-to-back connected inverters comprises an inverter coupled to a tri-state inverter.

7. The scan flip-flop of claim 1, wherein the slave latch comprises a second plurality of back-to-back connected inverters and wherein, each of the second plurality of back-to-back connected inverters comprises an inverter coupled to a tri-state inverter.

8. An apparatus comprising:
   a scan chain element configured to generate a dedicated scan chain output, the scan chain element comprising a plurality of scan flip-flops that are connected serially;
   a first scan flip-flop of the plurality of scan flip-flops that is at a beginning of the scan chain element, wherein a scan data input to each of the plurality of scan flip-flops is a dedicated scan output of a previous scan flip-flop, except for the first scan flip-flop, wherein each of the plurality of scan flip-flops comprises:
   a partial multiplexer coupled to a master latch, the partial multiplexer configured to receive a scan enable wherein the partial multiplexer comprises an OR gate coupled to a tri-stated AND gate;
   a tri-state inverter coupled to an output of the master latch, a slave latch configured to receive an output of the tri-state inverter; and
   a delay element that is coupled to a first output of the slave latch;
   the delay element receives the scan enable and configured to generate a dedicated scan output, the delay element delays the first output of the slave latch in response to the scan enable.

9. The apparatus of claim 8, wherein the first scan flip-flop receives a first scan data input at a logic high in a data state; the first scan data input being generated using an OR gate in response to an inverted scan enable and a scan output of an input/output block.

10. The apparatus of claim 8, wherein the partial multiplexer receives a data input, a scan data input, a clock input, an inverted clock input and selects one of the data input and the scan data input in response to the scan enable.

11. The apparatus of claim 8, wherein the dedicated scan output is generated without inverting the scan enable.

12. The apparatus of claim 8, wherein the delay element comprises a single-input bubbled NAND gate configured to delay the first output of the slave latch in response to the scan enable to generate the dedicated scan output; wherein in a data state the dedicated scan output is configured to a logic high state such that the dedicated scan output does not toggle.

13. The apparatus of claim 8, further comprising:
   a first inverter coupled to a second output of the slave latch, the first inverter being configured to generate a data output in response to the second output of the slave latch.

14. The apparatus of claim 8, wherein the master latch comprises a first plurality of back-to-back connected inverters and wherein, each of the first plurality of back-to-back connected inverters comprises an inverter coupled to a tri-state inverter.

15. The apparatus of claim 8, wherein the slave latch comprises a second plurality of back-to-back connected inverters;

and wherein, each of the second plurality of back-to-back connected inverters comprises an inverter coupled to a tri-state inverter.

16. A method of generating a dedicated scan output at an output of a scan flip-flop, comprising:
   receiving a data input, a scan input and a scan enable in a partial multiplexer, wherein the partial multiplexer comprises an OR gate coupled to a tri-stated AND gate;
   selecting one of the data input and the scan data input in response to the scan enable SCAN; wherein the partial multiplexer is coupled to a master latch;
   inverting an output of the master latch using a tri-state inverter to generate an input to a slave latch;
   receiving a first output of the slave latch and the scan enable in a delay element that is configured to generate the dedicated scan output in response to the scan enable; and
   delaying the first output of the slave latch using the delay element in response to the scan enable.

17. The method of claim 16, wherein generating the dedicated scan output further comprises:
   generating the dedicated scan output without inverting the scan enable.

18. The method of claim 16 and further comprising:
   configuring the dedicated scan output to a logic high in a data state such that the dedicated scan output does not toggle.

19. The method of claim 16, wherein delaying the first output of the slave latch further comprises delaying the first output of the slave latch using single-input bubbled NAND gate in response to the scan enable to generate the dedicated scan output.

20. The method of claim 16, wherein the master latch comprises a first plurality of back-to-back connected inverters; and wherein, each of the first plurality of back-to-back connected inverters comprises an inverter coupled to a tri-state inverter, and wherein the slave latch comprises a second plurality of back-to-back connected inverters; and wherein, each of the second plurality of back-to-back connected inverters comprises an inverter coupled to a tri-state inverter.

* * * * *